United States Patent

Yasui

(10) Patent No.: US 12,225,667 B2
(45) Date of Patent: Feb. 11, 2025

(54) MOVING WORK MANAGEMENT DEVICE, MOUNTING SYSTEM, MOVING WORK DEVICE, AND MOVING WORK MANAGEMENT METHOD

(71) Applicant: FUJI CORPORATION, Chiryu (JP)

(72) Inventor: Yoshihiro Yasui, Nagoya (JP)

(73) Assignee: FUJI CORPORATION, Chiryu (JP)

(*) Notice: Subject to any disclaimer, the term of this patent is extended or adjusted under 35 U.S.C. 154(b) by 485 days.

(21) Appl. No.: 17/266,027

(22) PCT Filed: Aug. 23, 2018

(86) PCT No.: PCT/JP2018/031144
§ 371 (c)(1),
(2) Date: Feb. 4, 2021

(87) PCT Pub. No.: WO2020/039542
PCT Pub. Date: Feb. 27, 2020

(65) Prior Publication Data
US 2021/0315140 A1    Oct. 7, 2021

(51) Int. Cl.
*H05K 13/04* (2006.01)
*H05K 13/08* (2006.01)

(52) U.S. Cl.
CPC ..... *H05K 13/0419* (2018.08); *H05K 13/0404* (2013.01); *H05K 13/086* (2018.08)

(58) Field of Classification Search
CPC .......................... H05K 13/0404; H05K 13/086
See application file for complete search history.

(56) References Cited

U.S. PATENT DOCUMENTS

2016/0192546 A1* 6/2016 Teraoka ............... H05K 13/086
                                                        414/806
2018/0242485 A1* 8/2018 Kondo ............... H05K 13/0473

FOREIGN PATENT DOCUMENTS

| EP | 3190864 A1 * | 7/2017 | ......... H05K 13/0069 |
| EP | 3 344 027 A1 | 7/2018 | |
| JP | 2005-235952 A | 9/2005 | |
| JP | 2015149407 A * | 8/2015 | |
| WO | WO-2017033268 A1 * | 3/2017 | ........... H05K 13/021 |

OTHER PUBLICATIONS

International Search Report issued on Oct. 30, 2018 in PCT/JP2018/031144 filed on Aug. 23, 2018, 2 pages.

* cited by examiner

Primary Examiner — Livius R. Cazan
(74) Attorney, Agent, or Firm — Oblon, McClelland, Maier & Neustadt, L.L.P.

(57) ABSTRACT

A moving work management device is used in a mounting system including a mounting device having a supply section, configured to load a feeder having a holding member configured to hold a component, to one or more loading sections, and a mounting section configured to mount the component supplied from the supply section to a mounting target; and a moving work device having a moving control section, configured to move the feeder, for collecting the feeder from or replenishing the feeder to the supply section. After acquiring the component depletion notification notifying of a component depletion of a feeder, the moving work management device creates arrangement execution information of moving work device for moving and loading the feeder for exchanging to a loading section in the vicinity of the component depleted notification feeder.

4 Claims, 7 Drawing Sheets

MOVING WORK MANAGEMENT DEVICE, MOUNTING SYSTEM, MOVING WORK DEVICE, AND MOVING WORK MANAGEMENT METHOD

TECHNICAL FIELD

The present specification discloses a mobile work management device, a mounting system, a moving work device, and a moving work management method.

BACKGROUND ART

Conventionally, a mounting system has been proposed in which a feeder storage is placed in a production line, and an exchange robot (moving work device) is provided which moves between mounting devices and a feeder storage section and exchanges feeders between the mounting devices and the feeder storage section (see Patent Document 1, for example). In this mounting system, since the feeder used in any of the mounting devices can be replenished or collected at the feeder storage section, replenishment or collection of feeders can easily be performed by an operator.

PATENT LITERATURE

Patent Document 1: International Publication No. 2017/033268

BRIEF SUMMARY

Technical Problem

However, even though the moving work device automatically exchanges feeders in the mounting system of Patent Document 1, no consideration has been given to how the exchange operation of feeders in which component depletion has occurred is to be performed. Since the moving work device may require moving time during the exchange operation, it is desirable to further shorten the time required when components of a feeder are depleted.

It is a principal object of the present disclosure to provide a moving work management device, a mounting system, a moving work device, and a moving work management method capable of further shortening the time required when components of a feeder are depleted in a feeder exchange operation of a moving work device.

The present disclosure adopts the following means to achieve the main object described above.

The moving work management device of the present disclosure is used in a mounting system, comprising: a mounting device having a supply section, configured to load a feeder to one or more loading sections, the feeder having a holding member configured to hold a component, and a mounting section configured to mount the component supplied from the supply section to a mounting target; and a moving work device having a moving control section for collecting from or replenishing the feeder to the supply section and moving the feeder; wherein the moving work management device comprises a management control section for creating arrangement execution information for the moving work device to obtain a feeder for exchanging to a loading section in the vicinity of a feeder for which an advance notification of component depletion has been made after a component depletion notification notifying of a component depletion of the feeder has been acquired.

After acquiring the component depletion notification notifying of a component depletion of a feeder, the moving work management device creates arrangement execution information of moving work device for moving and loading the feeder for exchanging to a loading section in the vicinity of the component depleted notification feeder. Thereafter, the moving work device that has acquired the arrangement execution information moves and loads the feeder for exchanging to the loading section in the vicinity of the feeder in which component depletion has occurred. In this moving work management device, since the feeder for exchanging is disposed in advance in the vicinity of the feeder in which an advance notification of component depletion has been made, it is possible to further shorten the time required upon component depletion compared with the case in which the moving work device moves the feeder for exchanging after a component depletion has occurred. Here, the expression "in the vicinity of the feeder in which an advance notification of component depletion has been made" may be, for example, a position closer to the loading section to which the feeder for exchanging can be loaded, but it is more preferable if the position is the closest position.

BRIEF DESCRIPTION OF DRAWINGS

FIG. 7 is a diagram showing the loading of exchange feeder 17b to available loading section 28a.

DESCRIPTION OF EMBODIMENTS

Figure 1:
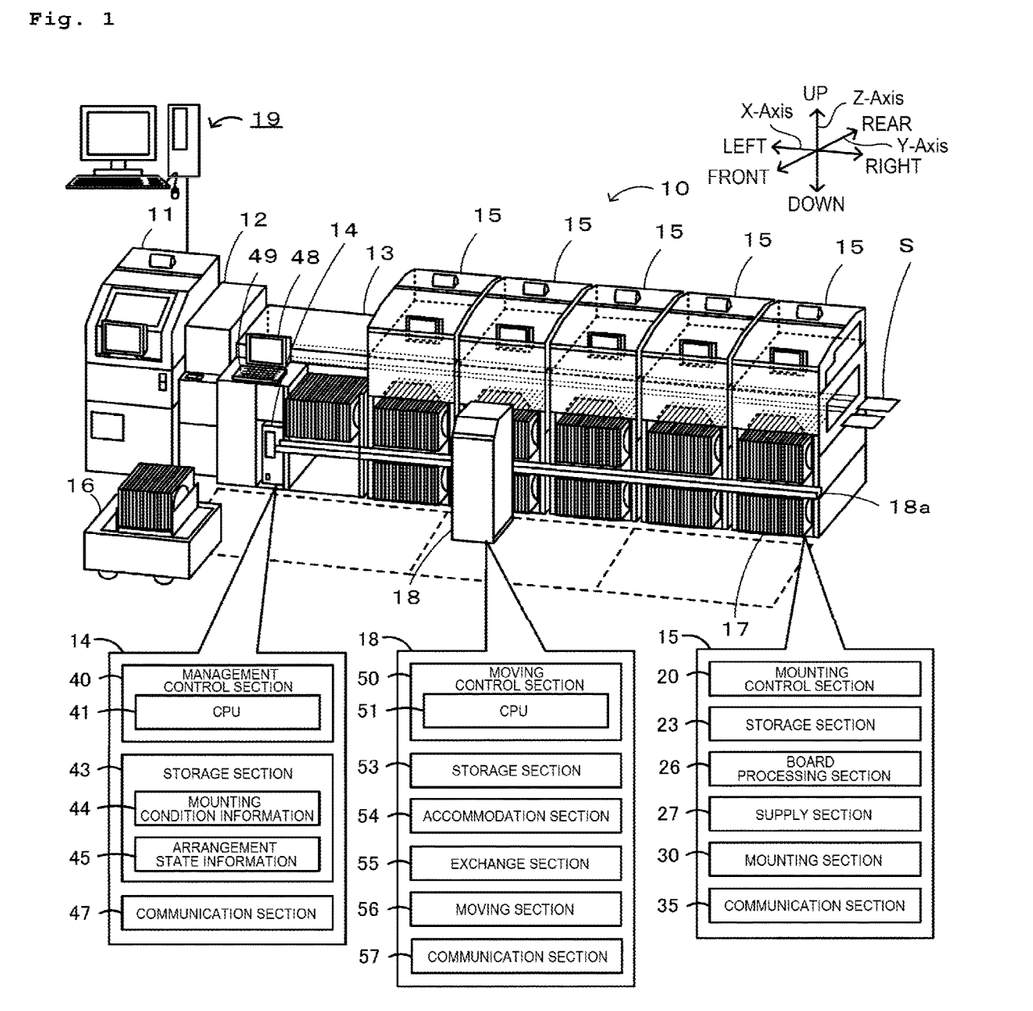
FIG. 1 is a schematic diagram showing an example of mounting system 10.
Figure 2:
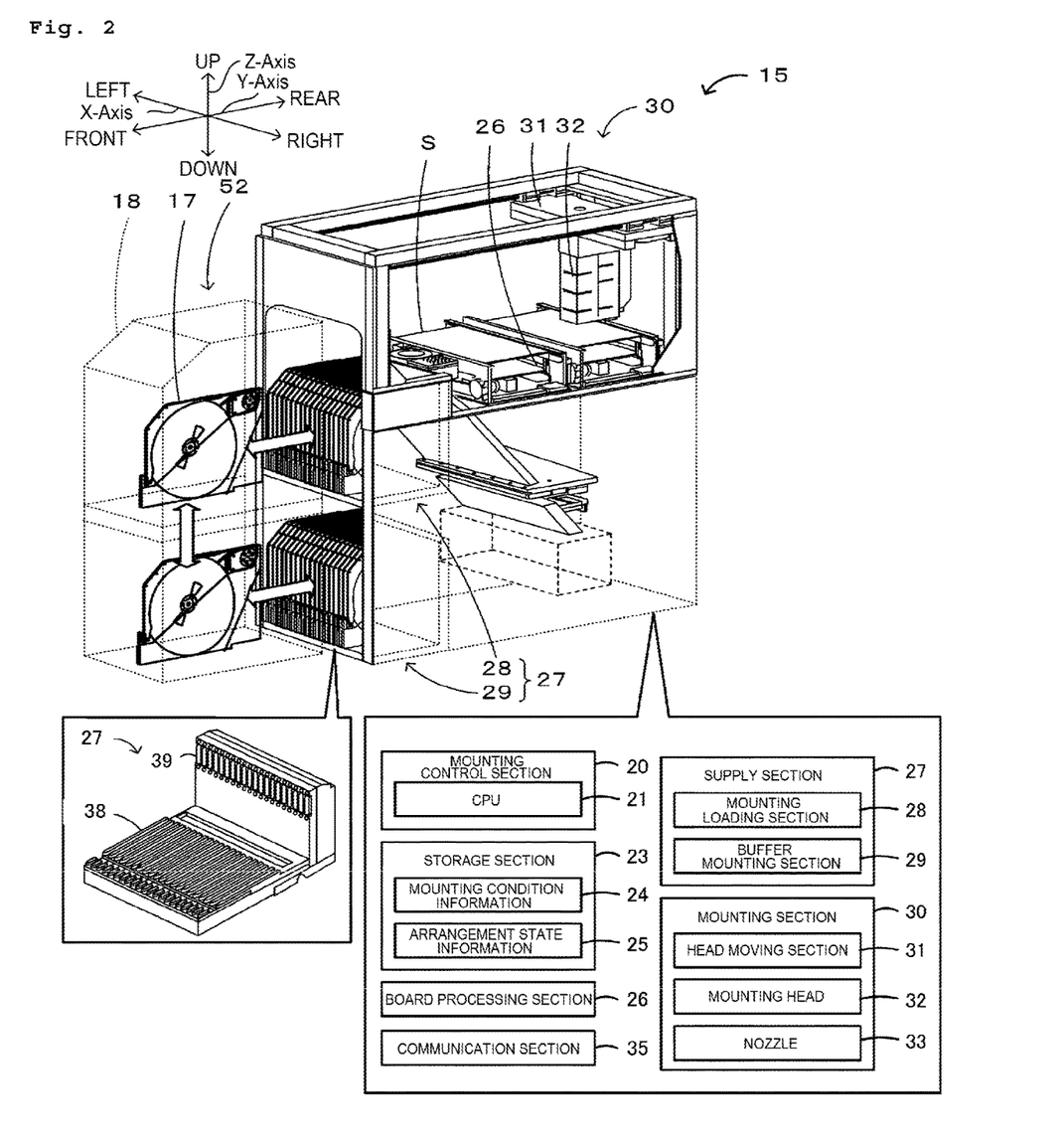
FIG. 2 is a diagram schematically showing a configuration of mounting device 15 and loader 18.
Figure 3:
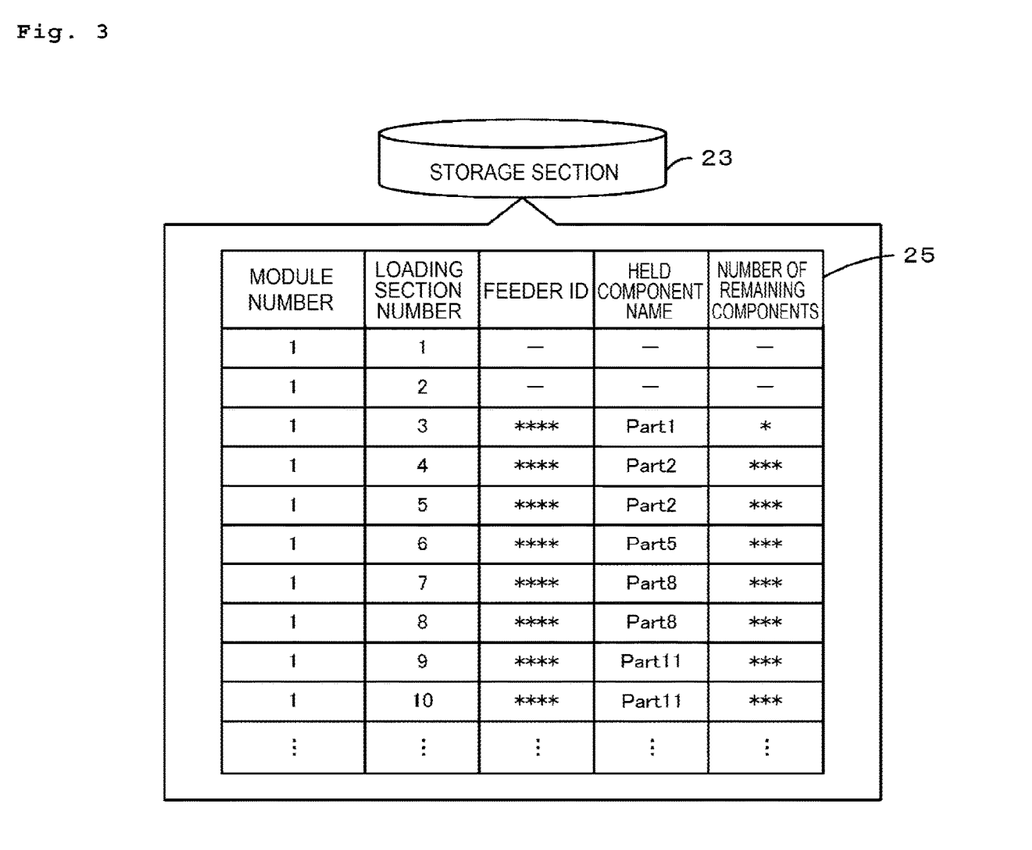
FIG. 3 is a diagram showing an example of arrangement state information 25 stored in storage section 23.

The present embodiment will be described below with reference to the drawings. FIG. 1 is a schematic diagram showing an example of mounting system 10 of the present disclosure. FIG. 2 is a diagram schematically showing a configuration of mounting device 15 and loader 18 which is a moving work device. FIG. 3 is a diagram showing an example of arrangement state information 25 stored in storage section 23 of mounting device 15. In the present embodiment, the left-right direction (X-axis), the front-rear direction (Y-axis), and the up-down direction (Z-axis) are as shown in FIGS. 1 and 2.

Mounting system 10 is configured, for example, as a production line in which devices are arranged in the conveyance direction of board S, the devices being devices for performing processes to mount components on board S which is a mounting target. Here, the mounting target is described as board S, but the present disclosure is not particularly limited to this as long as the object is an object on which components are mounted and may be a substrate having a three-dimensional shape. As shown in FIG. 1, mounting system 10 includes printing device 11, print inspection device 12, feeder storage section 13, management PC 14, mounting device 15, automatic conveyance vehicle 16, loader 18, host PC 19, and the like. Printing device 11 is a device for printing solder paste or the like on board S. Print inspection device 12 is a device for inspecting the state of the printed solder. Feeder storage section 13 is a storage location for storing feeder 17 used in mounting device 15. Feeder storage section 13 is provided below the conveyance device between print inspection device 12 and mounting device 15.

Mounting device 15 is a device for picking up components and mounting components on board S. Mounting device 15 includes mounting control section 20, storage section 23, board processing section 26, supply section 27, mounting section 30, and communication section 35. As shown in FIG. 2, mounting control section 20 is configured as a microprocessor centered on CPU 21 and controls the entire device. Mounting control section 20 outputs control signals to board processing section 26, supply section 27, and mounting section 30, and receives signals from board processing section 26, supply section 27, and mounting section 30. Storage section 23 stores mounting condition information 24, arrangement state information 25, and the like. Mounting condition information 24 is a production job and includes information such as information on components, the arrangement order in which components are mounted on board S, arrangement positions, and loading positions of feeders 17 from which components are picked up. Mounting condition information 24 is generated by host PC 19 with an order and arrangement in which the mounting efficiency is high, transmitted from host PC 19, and stored in storage section 23. Arrangement state information 25 is information including the type and the usage state of feeder 17 (component type, remaining number of components, etc.) that is currently installed in supply section 27 of mounting device 15. Arrangement state information 25 includes the module number of supply section 27, the loading section number indicating the position of the loading section, the ID of feeder 17 loaded to the loading section, the name of the component held by feeder 17, the number of remaining components, and the like. Arrangement state information 25 is appropriately updated with current information when feeder 17 is loaded or unloaded. Communication section 35 is an interface for exchanging information with external devices such as management PC 14 and host PC 19.

Board processing device 26 is a unit for conveying in, transporting, securing and unloading board S at a mounting position. Board processing device 26 has a pair of conveyor belts extending in the left-right direction and spaced apart from each other in the front-rear direction in FIG. 1. Board S is conveyed by the conveyor belts.

Supply section 27 is a unit for supplying components to mounting section 30. Supply section 27 loads feeders 17 to one or more loading sections, each feeder 17 having a reel around which a tape serving as a holding member for holding components is wound. As shown in FIG. 2, supply section 27 has two upper and lower loading sections to which feeder 17 can be loaded in the front direction. The upper stage is mounting loading section 28 from which a component can be extracted by mounting section 30, and the lower stage is buffer loading section 29 from which a component cannot be extracted by mounting section 30. Here, mounting loading section 28 and buffer loading section 29 are collectively referred to as the loading section. The loading sections may be managed in module units grouping a predetermined number (e.g., 4 or 12) of feeders 17. Supply section 27 has multiple slots 38, arranged in the X-direction at predetermined intervals so that rail members of feeders 17 are inserted, and connecting portions 39 into which connectors provided at the distal ends of feeders 17 are inserted. Each feeder 17 includes a controller (not shown). The controller stores information such as tape IDs and component types included in feeder 17 and the remaining number of components. When feeder 17 is connected to connecting portion 39, the controller transmits information of feeder 17 to mounting control section 20.

Mounting section 30 is a unit for picking up components from supply section 27 and arranges the components on board S fixed to board processing section 26. Mounting section 30 includes head moving section 31, mounting head 32, and nozzle 33. Head moving section 31 includes a slider guided by guide rails and moved in the XY-direction, and a motor for driving the slider. Mounting head 32 is configured to pick up one or more components and be moved in the XY-direction by head moving section 31. Mounting head 32 is attached to the slider in a detachable manner. One or more nozzles 33 are attached to the lower face of mounting head 32 in a detachable manner. Nozzle 33 is configured to pick up components by use of negative pressure. Aside from nozzle 33, the pickup member for picking up components may be a mechanical chuck or the like that mechanically holds components.

Management PC 14 is a device for managing feeder 17 and is a moving work management device for generating execution data executed by loader 18. Management PC 14 includes management control section 40, storage section 43, communication section 47, display section 48, and input device 49. Management control section 40 is configured as a microprocessor centered on CPU 41 and controls the entire device. Storage section 43 is a device such as an HDD for storing various data such as a processing program. As shown in FIG. 1, storage section 43 stores mounting condition information 44, arrangement execution information 45, and the like. Mounting condition information 44 is the same data as mounting condition information 24 and is acquired from host PC 19 or the like. Although detailed descriptions will be given later, arrangement execution information 45 is information for moving and loading exchange feeder 17b to the vicinity of notification feeder 17a (see FIGS. 6 and 7) for which a notification of component depletion has been made in advance. Arrangement execution information 45 is created by management control section 40 after the notification of component depletion has been made. Communication section 47 is an interface for exchanging information with external devices such as mounting device 15 and host PC 19. Display section 48 is a liquid crystal display for displaying various information. Input device 49 includes a keyboard, a mouse, and the like through which an operator inputs various commands. Automatic conveyance vehicle 16 is configured to automatically convey feeder 17, a member used in mounting system 10, and the like between a storage chamber (not shown) and feeder storage section 13.

Loader 18 is a moving work device and is a device that moves within a moving area at the front face of mounting system 10 (see dashed lines in FIG. 1) and automatically collects and replenishes feeders 17 of mounting device 15. Loader 18 includes moving control section 50, storage section 53, accommodation section 54, exchange section 55, moving section 56, and communication section 57. Moving control section 50 is configured as a microprocessor centered on CPU 51 and controls the entire device. Storage section 53 is an HDD or the like for storing various data such as processing programs and stores arrangement execution information 45. Accommodation section 54 has an accommodation space for accommodating feeders 17. Accommodation section 54 is configured to accommodate, for example, four feeders 17. Exchange section 55 is a mechanism for moving feeder 17 in and out as well between the upper and lower levels (see FIG. 2). Exchange section 55 has a clamp for clamping feeder 17, a Y-axis slider for moving the clamp in the Y-axis direction (front-rear direction), and a Z-axis slider for moving the clamp in the Z-axis direction (up-down direction). Exchange section 55 loads and unloads feeder 17 at mounting loading section 28 and loads and unloads feeder 17 at buffer loading section 29. Moving section 56 is a mechanism for moving loader 18 in the X-axis direction (the left-right direction) along X-axis rail 18a disposed on the front face of mounting device 15. Communication section 57 is an interface for exchanging information with external devices such as management PC 14 and mounting device 15. Loader 18 outputs the current position and the contents of the executed operation to management PC 14.

Host PC 19 (see FIG. 1) is configured as a server for managing information of each device in mounting system 10. Host PC 19 includes a control section for controlling the entire device, a storage section for storing various information, and a communication section for performing bidirectional communication with external devices such as mounting system 10, automatic conveyance vehicle 16, and loader 18. Host PC 19 acquires and manages information of mounting system 10 in addition to creating and managing condition information used in the mounting of components.

Figure 4:
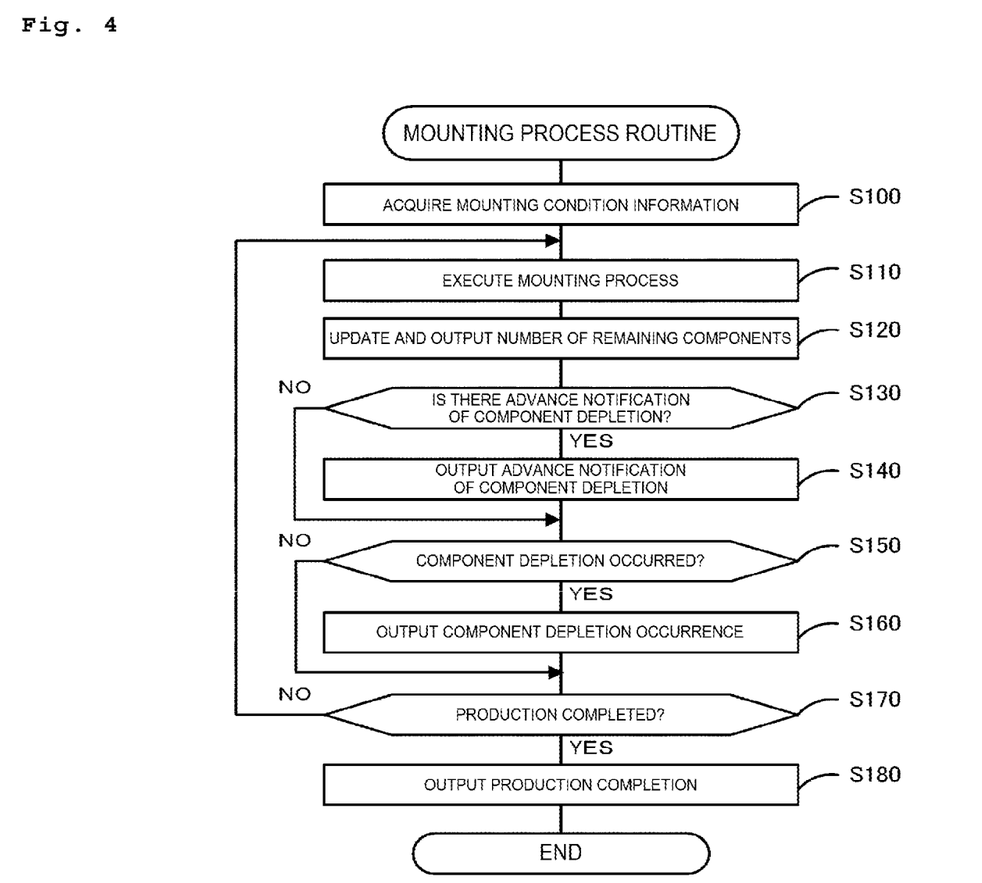
FIG. 4 is a flowchart showing an example of a mounting process routine.

Next, among the operations of mounting system 10 of the present embodiment configured as described above, the process by which mounting device 15 mounts a component on board S will be described first. FIG. 4 is a flowchart showing an example of a mounting process routine executed by CPU 21 included in mounting control section 20 of mounting device 15. This routine is stored in storage section 23 of mounting device 15 and executed in accordance with a start instruction from an operator. When this routine is started, CPU 21 first acquires the mounting condition information of board S to be manufactured at this time (S100). CPU 21 acquires the mounting condition information from host PC 19. Next, CPU 21 executes a mounting process (S110). In the mounting process, CPU 21 causes mounting head 32 to pick up a component from feeder 17 at a predetermined position based on mounting condition information 24 and moves the component to an arrangement position of board S. Next, CPU 21 updates the number of remaining components of the used component and outputs the updated number to host PC 19 and management PC 14 (S120). Next, CPU 21 determines whether the number of remaining components reaches a predetermined advance notification number at which an advance notification of component depletion is to be made (S130), and when there is feeder 17 for which the number of remaining components reaches the advance notification number, CPU 21 outputs a notification of component depletion of feeder 17 to management PC 14 (S140). The advance notification of component depletion can be determined, for example, when the number of remaining components becomes less than or equal to a predetermined advance notification number, or when the time until component depletion, calculated from the number of remaining components and the number of components consumed per unit time, reaches a predetermined time period or the like. After S140 or when there is no advance notification of component depletion in S130, CPU 21 determines whether there is feeder 17 in which component depletion has occurred (S150). When there is feeder 17 in which component depletion has occurred, CPU 21 outputs information indicating that component depletion has occurred to management PC 14 (S160). Management PC 14 that has acquired the information on the occurrence of component depletion creates exchange information that includes the position of component depleted feeder 17 and the position of exchange feeder 17b, and outputs the exchange information to loader 18. After S160 or in a case where there is no component depletion in S150, CPU 21 determines whether the production of board S is completed (S170), and executes the processes of S110 and subsequent steps when the production is not completed. On the other hand, when production is completed in S170, CPU 21 outputs information indicating that production is completed to host PC 19 or management PC 14 (S180) and terminates this routine.

Figure 5:
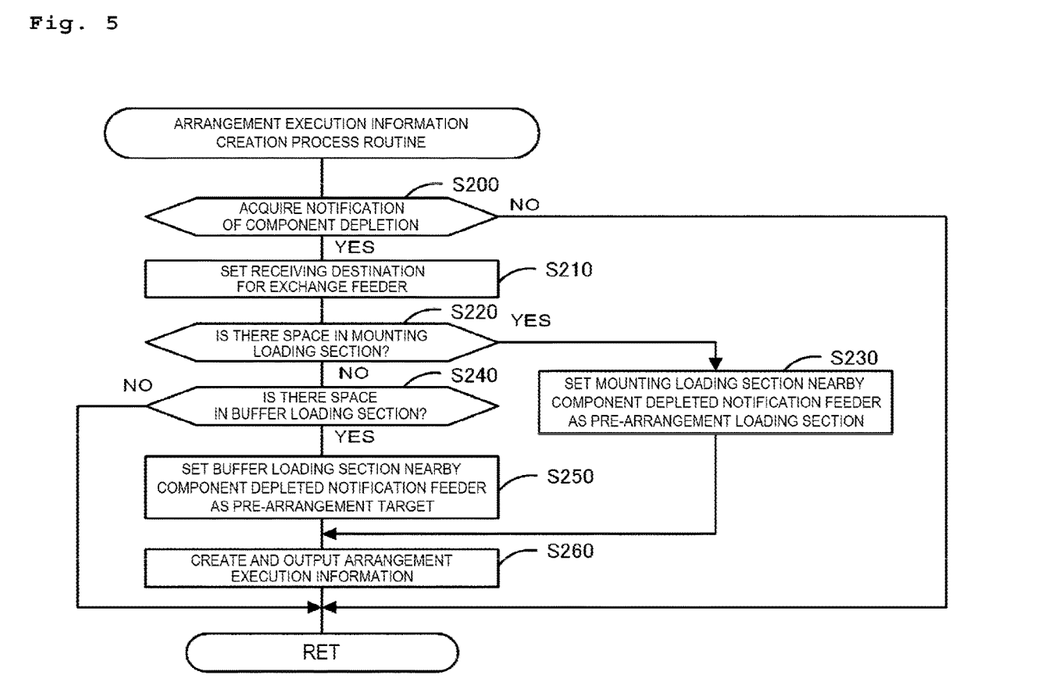
FIG. 5 is a flowchart showing an example of an arrangement execution information creation process routine.

Next, the process for creating arrangement execution information 45 performed by management PC 14 will be described. This process creates information for performing a pre-arrangement process for arranging feeder 17 for exchanging in the vicinity of feeder 17 where component depletion is to occur before the component depletion occurs. Management PC 14 is set to place highest priority on creating the exchange information, and then create arrangement execution information 45 next. FIG. 5 is a flowchart showing an example of an arrangement execution information creation process routine executed by CPU 41 included in management control section 40 of management PC 14. This routine is stored in storage section 43 of management PC 14 and repeatedly executed after the booting up of mounting system 10. When this routine is started, CPU 41 first determines whether an advance notification of component depletion has been acquired (S200). The advance notification of component depletion may be created by mounting device 15 or host PC 19 and transmitted to management PC 14, or management PC 14 may directly or indirectly acquire the number of remaining components from mounting device 15 and CPU 41 may create and acquire the advance notification in the manner described above. If an advance notification of component depletion has not been acquired, CPU 41 terminates the routine.

On the other hand, when an advance notification of component depletion is acquired in S200, CPU 41 searches for the location where exchange feeder 17b corresponding to component depleted notification feeder 17a is stored and sets the destination of exchange feeder 17b (S210). In mounting system 10, since feeder 17 for exchanging is stored in feeder storage section 13 by automatic conveyance vehicle 16, the receiving destination is normally set at a predetermined position in feeder storage section 13. Next, CPU 41 determines whether there is an available space in mounting loading section 28 to which notification feeder 17a is loaded (S230). When there is space in mounting loading section 28 (also referred to as available loading section 28a), CPU 41 sets available loading section 28a that is closer to notification feeder 17a, as a pre-arrangement loading section for loading exchange feeder 17b (S230). CPU 41 may set the available loading section 28a closest to notification feeder 17a as a pre-arrangement loading section. At this juncture, when there is no space in the module to which notification feeder 17a is loaded, CPU 41 may determine whether there is space in an adjacent module and set the pre-arrangement loading section in a mounting loading section 28 capable of receiving as many components as possible. On the other hand, when there is no space in mounting loading section 28 in S220, CPU 41 determines whether there is space in buffer loading section 29 (S240). When there is space in buffer loading section 29, buffer loading section 29 closer to notification feeder 17a is set as the pre-arrangement loading section (S250). After S250 or after S230, CPU 41 then creates arrangement execution information 45 including the position of the receiving destination set in S210 and the position of the pre-arrangement loading section set in S230 or S250, outputs arrangement execution information 45 to loader 18 (S260), and terminates the routine.

Figure 6:
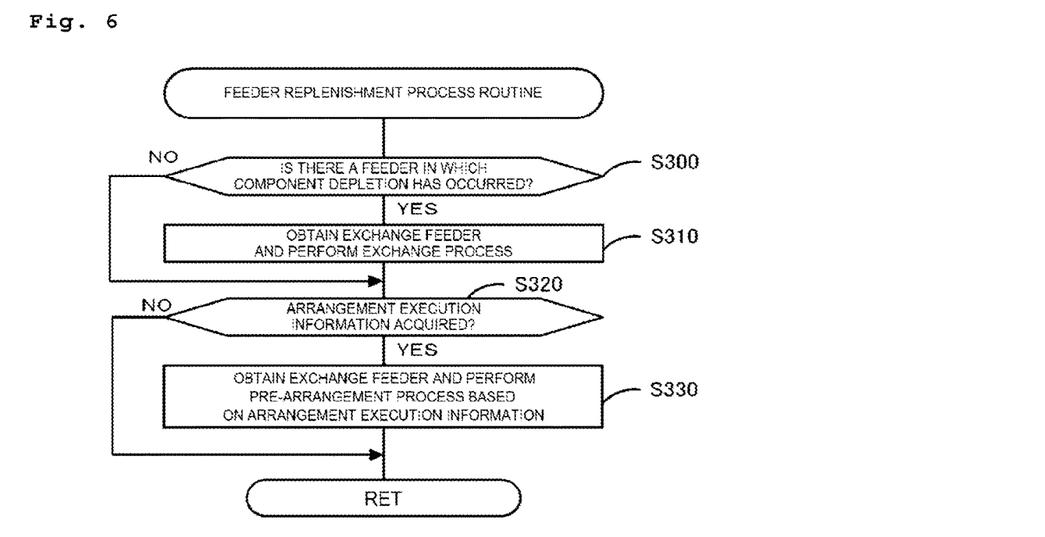
FIG. 6 is a flowchart showing an example of a feeder replenishment process routine.

Next, the feeder replenishment process executed by loader 18 that has acquired the arrangement execution information will be described. FIG. 6 is a flowchart showing an example of a feeder replenishment process routine executed by CPU 51 included in moving control section 50 of loader 18. This routine is stored in storage section 53 of loader 18 and repeatedly executed after the booting up of loader 18. When this routine is started, CPU 51 first determines whether there is any feeder 17 in which component depletion has occurred based on whether exchange information has been acquired from management PC 14 (S300). When there is feeder 17 for which an advance notification has been made, CPU 51 obtains exchange feeder 17b to be exchanged with component depleted feeder 17 from feeder storage section 13 or buffer loading section 29, moves exchange feeder 17b to the front of above-mentioned mounting loading section 28 and exchanges feeder 17b (S310). After S310 or when completion depletion has not occurred in S300, CPU 51 determines whether arrangement execution information 45 has been acquired from management PC 14 (S320). If arrangement execution information 45 has not been acquired, CPU 51 terminates the routine. On the other hand, when arrangement execution information 45 has been acquired, CPU 51 executes, based on arrangement execution information 45, a process of obtaining exchange feeder 17b from feeder storage section 13 or buffer loading section 29, moving exchange feeder 17b to the front face of the pre-arrangement loading section, and loading exchange feeder 17b thereto. Loader 18 is set to preferentially execute the component depleted feeder exchange over the pre-arrangement process.

Figures 7, 7A:
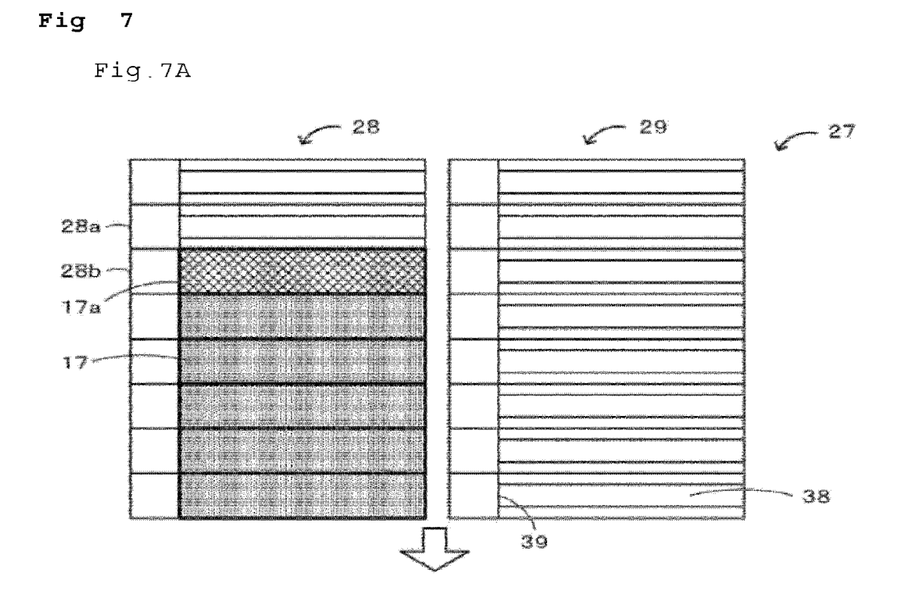
Figure 7B:
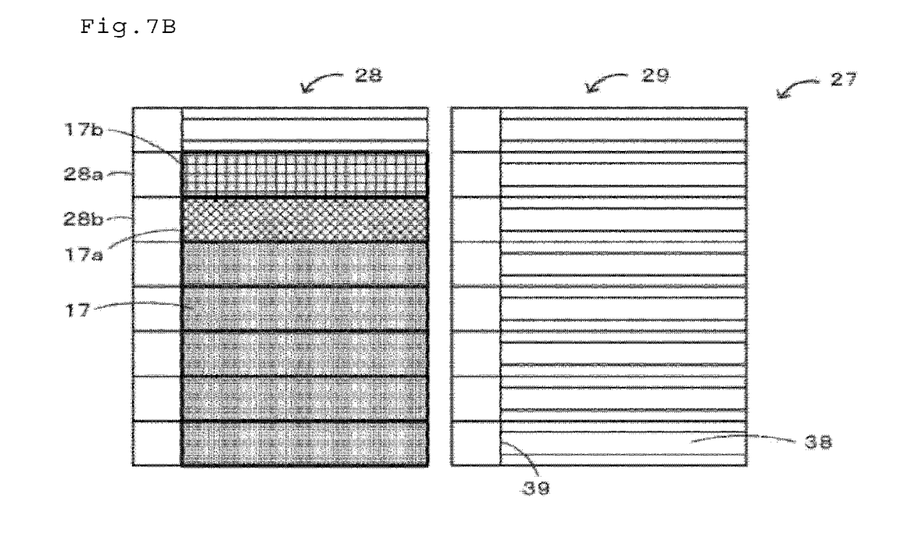
Figures 8, 8A:
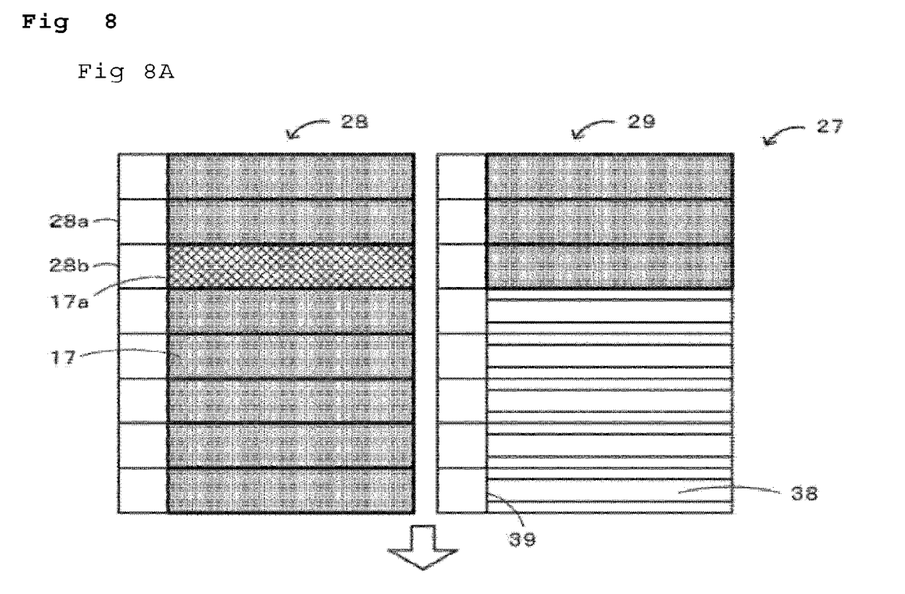
FIG. 8 is a diagram showing the loading of exchange feeder 17b to buffer loading section 29.
Figure 8B:
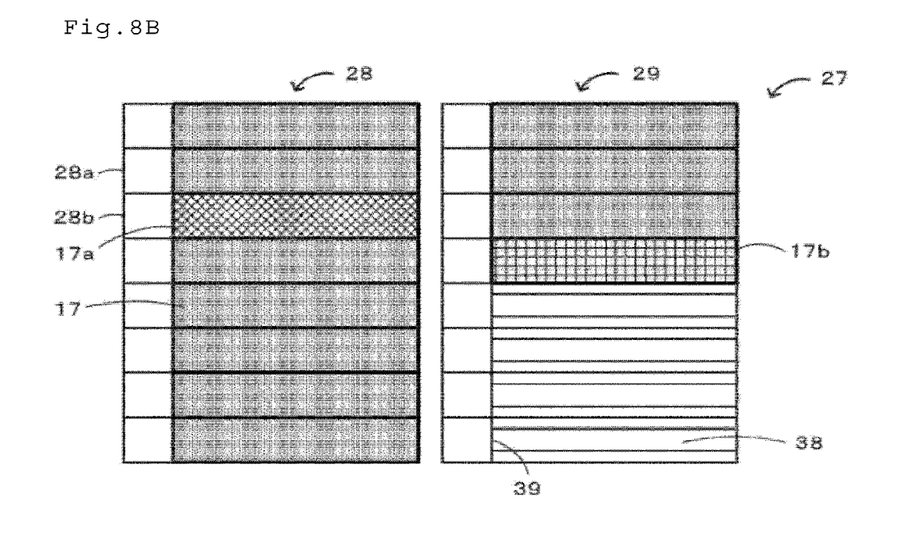

FIG. 7 is a diagram showing the loading of exchange feeder 17b to available loading section 28a, FIG. 7A is a view when a notification of component depletion is made, and FIG. 7B is a view in which exchange feeder 17b is loaded to the pre-arrangement loading section. FIG. 8 is a diagram showing the loading of exchange feeder 17b to buffer loading section 29, FIG. 8A is a view when a notification of component depletion is made, and FIG. 8B is a view in which exchange feeder 17b is loaded to the pre-arrangement loading section. As shown in FIG. 7, when there is an available loading section 28a in the vicinity of component depleted notification loading section 28b to which component depleted notification feeder 17a is loaded, exchange feeder 17b is loaded to mounting loading section 28 at a closer position. In this case, even if feeder 17 is not moved, components can be immediately picked up directly from exchange feeder 17b. As shown in FIG. 8, when there is no space in mounting loading section 28, exchange feeder 17b is loaded to the closer buffer loading section 29. Accordingly, since the moving distance is short when component depletion occurs, exchanging of feeder 17 can be performed in as short a time as possible. In mounting system 10, although the production of board S stops when component depletion of feeder 17 occurs, the time period can be made as short as possible.

Here, the correspondence between the constituent elements of the present embodiment and the constituent elements of the present disclosure will be specified. Mounting device 15 of the present embodiment corresponds to a mounting device, loader 18 corresponds to a moving work device, and management PC 14 corresponds to a moving work management device. In addition, supply section 27 corresponds to a supply section, mounting section 30 corresponds to a mounting section, management control section 40 corresponds to a management control section, and moving control section 50 corresponds to a moving control section.

In management PC 14 described above, after acquiring the component depletion notification notifying of the component depletion of feeder 17, exchange feeder 17b is obtained and arrangement execution information 45 of loader 18 for moving and loading exchange feeder 17b to the loading section in the vicinity of component depleted notification feeder 17a is created. Thereafter, loader 18 that has acquired the arrangement execution information moves and loads exchange feeder 17b to the loading section in the vicinity of component depleted notification feeder 17a. In management PC 14, since exchange feeder is disposed in advance in the vicinity of the feeder in which an advance notification of component depletion has been made, it is possible to further shorten the time required upon component depletion compared with the case in which loader 18 moves exchange feeder 17b after a component depletion has occurred.

Further, supply section 27 has mounting loading section 28 in which mounting section 30 is capable of picking up the component and buffer mounting section 29 in which mounting section 30 is incapable of picking up the component; and management control section 40 creates arrangement execution information 45 in a manner that prioritizes space in mounting loading section 28 as a moving destination for exchange feeder 17b over buffer loading section 29 when loading exchange feeder 17b to a loading section in the vicinity of component depleted notification feeder 17a. In management control section 40, since exchange feeder 17b is preferentially loaded to mounting loading section 28 as compared with buffer loading section 29 from which components cannot be picked up, mounting section 30 can also pick up components as is from exchange feeder 17b. In addition, supply section 27 includes one or more modules grouped together for each of the multiple loading sections, and when loading exchange feeder 17b to a loading section in the vicinity of component depleted notification feeder 17a, management control section 40 creates arrangement execution information 45 by giving priority to the loading section of the module including component depleted notification feeder 17a and giving the next priority to a loading section of an adjacent module. In management PC 14, since exchange feeder 17b can be provided to the module closer to component depleted notification feeder 17a, it is possible to further shorten the time required when a feeder is depleted of components. Furthermore, mounting system 10 includes feeder storage section 13 that stores feeder 17 in addition to mounting device 15, and management control section 40 creates arrangement execution information 45 in which exchange feeder 17b is taken from feeder storage section 13. In management PC 14, since exchange feeder 17b is obtained from feeder storage section 13 in mounting system 10, the moving distance of loader 18 can be further shortened.

In addition, management control section 40 creates exchange information for executing the exchange between feeder 17 in which component depletion has occurred and exchange feeder 17b and prioritizes creating arrangement execution information 45 after the exchange information. That is, management PC 14 creates the information executed by loader 18 with priority given to actual component depleted feeders over component depleted notification feeders. In management PC 14, since the highest priority is given to component depletion of feeder 17, it is possible to further shorten the time period during which mounting device 15 stops due to component depletion. Further, management control section 40 outputs the created arrangement execution information 45 to loader 18 and causes loader 18 to execute the obtaining, moving, and loading of exchange feeder 17b. Loader 18 can acquire arrangement execution information 45 and execute the process therein.

It is obvious that the present disclosure is not limited to the above-described embodiments and can be implemented in various modes as long as the modes belong to the technical scope of the present disclosure.

For example, in the above embodiment, arrangement execution information 45 is created by giving priority to the space of mounting loading section 28 as the moving destination of exchange feeder 17b over buffer loading section 29, but the present disclosure is not particularly limited thereto, and either may be given priority. It is preferable to set the space of mounting loading section 28 as the moving destination of exchange feeder 17b because it allows mounting section 30 to pick up components.

In the above embodiment, supply section 27 includes one or more modules grouped together for each of the multiple loading sections but is not particularly limited thereto and need not include a module.

Although the above embodiment has been described as having supply section 27 only on the front side of mounting device 15, supply section 27 may also be provided on the rear side of mounting device 15. Management control section 40 may then create arrangement execution information 45 including the availability of loading section of supply section 27 in the rear side. In this case, rear supply section 27 may have mounting loading section 28 and buffer loading section 29. Management control section 40 may create arrangement execution information 45 by giving priority to the closest loading section 28 among all the loading sections, and then next giving priority to the closest buffer loading section 29.

In the above embodiment, the processes of S130 to S160 for notifying of a component depletion or determining the occurrence of component depletion is described as being performed by mounting device 15, but the present disclosure is not particularly limited to this, and the processes may be performed by another device, for example, management PC 14 or host PC 19. Management PC 14 may obtain the determination result from the device that has performed the determination process or may obtain the determination result by performing the determination process in management control section 40 after obtaining the number of remaining components.

In the above embodiment, mounting system 10 includes printing device 11, print inspection device 12, feeder storage 13, management PC 14, and mounting device 15, but the present disclosure is not particularly limited thereto, and one or more of the above devices may be omitted or other devices may be added.

In the above embodiment, management PC 14 installed in feeder storage section 13 has been described as managing loader 18, but the present disclosure is not particularly limited to this and may be provided with this function in other devices such as host PC 19, mounting device 15, and loader 18, for example. In the above embodiment, loader 18 is configured to load or collect feeder 17, but the present disclosure is not particularly limited thereto, and may be configured so that automatic conveyance vehicle 16 loads and collects feeder 17.

In the above embodiment, the present disclosure was described by applying it to management PC 14 or mounting system 10d, but the present disclosure may be applied to loader 18 or to the moving work management method.

Here, the moving work management device, the mounting system, the moving work device, and the moving work management method according to the present disclosure may be configured as follows. For example, in the moving work management device of the present disclosure, the supply section may have a mounting loading section in which the mounting section is capable of picking up the component and a buffer loading section in which the mounting section is incapable of picking up the component; and the management control section may create the arrangement execution information in a manner that prioritizes space in the mounting loading section as a moving destination for the feeder for exchanging over the buffer loading section when loading the feeder for exchanging to a loading section in the vicinity of the feeder in which an advanced notification of component depletion has been made. In this moving work management device, since the feeder for exchange is preferentially loaded to the mounting loading section as compared with the buffer loading section from which components cannot be picked up, the mounting section can also pick up components as is from the feeder for exchange. Here, the buffer loading section may be provided in the stage below the mounting loading section.

In the moving work management device of the present disclosure, the supply section may include one or more modules grouped together for each of the multiple loading sections, and when loading a feeder for exchange to a loading section in the vicinity of a feeder for which an advance notification of component depletion is made, the management control section may create arrangement execution information by giving priority to the loading section of a module including the feeder for which an advance notification of component depletion is made and giving the next priority to a loading section of an adjacent module. In this moving work management device, since the feeder for exchange can be disposed in a module closer to the feeder for which an advanced notification of component depletion has been made, it is possible to further shorten the time required when a feeder is depleted of components.

In the moving work management device of the present disclosure, the mounting system may include a storage section for storing feeders in addition to mounting devices, and the management control section may create arrangement execution information for obtaining a feeder for exchange from the storage section. In this moving work management device, since the feeder for exchange is obtained from a storage section within the mounting system, the moving distance of the moving work device is further shortened.

In the moving work management device of the present disclosure, the management control section may create exchange information for performing an exchange of the feeder in which component depletion has occurred and the feeder for exchanging, and create the arrangement execution information in priority after the exchange information. That is, the moving work management device creates information executed by the moving work device with priority given to actual component depleted feeders over feeders for which an advanced notification of component depletion has been made. In this moving work managing device, since the highest priority is given to component depletion of a feeder, it is possible to further shorten the time period during which the mounting device stops due to component depletion.

In the moving work management device of the present disclosure, the management control section may output the created arrangement execution information to the moving work device to cause the moving work device to obtain, move, and load the feeder for exchanging. The moving work device can acquire the arrangement execution information and execute the process therein.

The mounting system of the present disclosure includes a mounting device having a supply section configured to load a feeder to one or more loading sections, the feeder having a holding member configured to hold a component, and a mounting section configured to mount the component supplied from the supply section to a mounting target; a moving work device having a moving control section configured to collect the feeder from or replenish the feeder to the supply section and move the feeder; and any of the moving work management devices described above.

In this mounting system, since the feeder for exchanging is disposed in advance in the vicinity of the feeder in which an advance notification of component depletion has been made, it is possible to further shorten the time required upon component depletion compared with the case in which the moving work device moves the feeder for exchanging after a component depletion has occurred.

The moving work device of the present disclosure is used in a mounting system including a mounting device having a supply section configured to load a feeder to one or more loading sections, the feeder having a holding member configured to hold a component, and a mounting section configured to mount the component supplied from the supply section to a mounting target; a moving work device configured to collect the feeder from or replenish the feeder to the supply section and move the feeder; and a moving work management device for creating information executed by the moving work device; wherein the moving work device comprises a moving control section configured to cause the moving work device to obtain a feeder for exchanging and moves and loads a feeder for exchanging to a loading section in the vicinity of a feeder for which an advance notification of component depletion has been made after a component depletion notification notifying of a component depletion of the feeder has been acquired.

In this moving work device, similarly to the moving work management device described above, since the feeder for exchanging is disposed in advance in the vicinity of a feeder in which an advance notification of component depletion has been made, it is possible to further shorten the time required upon component depletion compared with the case in which the moving work device moves the feeder for exchanging after a component depletion has occurred. In this moving work device, various modes of the above-described moving work management device may be employed or processes for achieving each function of the above-described moving work management device may be added.

The moving work management method of the present disclosure is used in a mounting system including a mounting device having a supply section configured to load a feeder to one or more loading sections, the feeder having a holding member configured to hold a component, a mounting section configured to mount the component supplied from the supply section to a mounting target, and a moving work device having a moving control section for collecting from or replenishing the feeder to the supply section and moving the feeder; wherein the moving work management method comprises a step for creating arrangement execution information for the moving work device to obtain a feeder for exchanging to a loading section in the vicinity of a feeder for which an advance notification of component depletion has been made after a component depletion notification notifying of a component depletion of the feeder has been acquired.

In this moving work management method, since the feeder for exchanging is disposed in advance in the vicinity of the feeder in which an advance notification of component depletion has been made, it is possible to further shorten the time required upon component depletion compared with the case in which the moving work device moves the feeder for exchanging after a component depletion has occurred. It should be noted that in this moving work management method, various modes of the above-described moving work management device may be employed, or steps for achieving each function of the above-described moving work management device may be added.

INDUSTRIAL APPLICABILITY

The present disclosure is applicable to the technological field of devices for picking up and mounting components.

REFERENCE SIGNS LIST

10 Mounting system, 11 Printing device, 12 Print inspection device, 13 Feeder storage section, 14 Management PC, 15 Mounting device, 16 Automatic conveyance vehicle, 17 Feeder, 17a Component depleted notification feeder, 17b Exchange feeder, 18 Loader, 18a X-axis rail, 19 Host PC, 20 Mounting control section, 21 CPU, 23 Storage section, 24 Mounting condition information, 25 Arrangement state information, 26 Board processing section, 27 Supply section, 28 Mounting loading section, 28a Available loading section, 28b Component depleted notification loading section, 29 Buffer loading section, 30 Mounting section, 31 Head moving section, 32 Mounting head, 33 Nozzle, 35 Communication section, 38 Slot, 39 Connecting section, 40 Management control section, 41 CPU, 43 Storage section, 44 Mounting condition information, 45 Arrangement execution information, 47 Communication section, 48 Display section, 49 Input device, 50 Moving control section, 51 CPU, 53 Storage section, 54 Accommodation section, 55 Exchange section, 56 Moving section, 57 Communication section, S Board

The invention claimed is:

1. A mounting system comprising:
    a mounting section configured to mount a component to a mounting target:
    a supply section configured to load a feeder having a holding member configured to hold the component, the supply section including a mounting loading section in which the mounting section is capable of picking up the component and a buffer loading section in which the mounting section is incapable of picking up the component, the buffer loading section located below the mounting loading section in the supply section;
    a moving work device having a moving control section, configured to move the feeder, for collecting the feeder from or replenishing the feeder to the mounting loading section and the buffer loading section of the supply section; and
    a management control section configured to
        determine an advance notification of component depletion in a first feeder, create arrangement execution information for the moving work device to obtain a second feeder to exchange for the first feeder, the arrangement execution information including a first position of the first feeder in the mounting loading section and a moving destination for the second feeder which is in a vicinity of the first feeder, by prioritizing space in the mounting loading section as the moving destination for the second feeder over the buffer loading section, control the moving work device to load the second feeder to the moving destination based on the arrangement execution information, and after a component depletion notification notifying of a component depletion of the first feeder has been acquired, control the moving work device to exchange the second feeder for the first feeder by moving the second feeder from the moving destination to the first position.

2. The mounting system of claim 1, wherein the management control section creates exchange information for performing an exchange of the first feeder in which component depletion has occurred and the second feeder, and creates the arrangement execution information in priority after the exchange information.

3. The mounting system of claim 1, wherein the management control section outputs the created arrangement execution information to the moving work device to cause the moving work device to obtain, move, and load the second feeder.

4. A moving work management method, used in a mounting system comprising:

a mounting section configured to mount a component to a mounting target;

a supply section configured to load a feeder having a holding member configured to hold the component, the supply section including a mounting loading section in which the mounting section is capable of picking up the component and a buffer loading section in which the mounting section is incapable of picking up the component, the buffer loading section located below the mounting loading section in the supply section; and a moving work device having a moving control section, configured to move the feeder, for collecting the feeder from or replenishing the feeder to the mounting loading section and the buffer loading section of the supply section, the moving work management method comprising:

determining an advance notification of component depletion in a first feeder, creating arrangement execution information for the moving work device to obtain a second feeder to exchange for the first feeder, the arrangement execution information including a first position of the first feeder in the mounting loading section and a moving destination for the second feeder which is in a vicinity of the first feeder, by prioritizing space in the mounting loading section as the moving destination for the second feeder over the buffer loading section, controlling the moving work device to load the second feeder to the moving destination based on the arrangement execution information, and after a component depletion notification notifying of a component depletion of the first feeder has been acquired, controlling the moving work device to exchange the second feeder for the first feeder by moving the second feeder from the moving destination to the first position.

\* \* \* \* \*